United States Patent [19]
Komori et al.

[11] Patent Number: 5,455,437
[45] Date of Patent: Oct. 3, 1995

[54] SEMICONDUCTOR DEVICE HAVING CRYSTALLINE DEFECT ISOLATION REGIONS

[75] Inventors: Shigeki Komori; Takashi Kuroi, both of Hyogo, Japan

[73] Assignee: Mitsubishi Denki Kabushiki Kaisha, Tokyo, Japan

[21] Appl. No.: 261,355

[22] Filed: Jun. 16, 1994

Related U.S. Application Data

[63] Continuation of Ser. No. 940,131, Sep. 3, 1992, abandoned.

[30] Foreign Application Priority Data

Nov. 20, 1991 [JP] Japan ............ 3-304726
May 22, 1992 [JP] Japan ............ 4-131082

[51] Int. Cl.$^6$ .................... H01L 29/32; H01L 29/227
[52] U.S. Cl. .................... 257/376; 257/523; 257/590; 257/617
[58] Field of Search .................... 257/523, 590, 257/617, 156, 372, 376, 131, 611, 612, 370

[56] References Cited

U.S. PATENT DOCUMENTS

| | | | |
|---|---|---|---|
| 3,899,793 | 8/1975 | Wakamiya et al. | 257/590 |
| 4,053,925 | 10/1977 | Burr et al. | 257/376 |
| 4,240,096 | 12/1980 | Hiraki et al. | 257/523 |
| 4,259,683 | 3/1981 | Adler et al. | 257/590 |
| 4,278,475 | 7/1981 | Bartko et al. | 257/617 |
| 4,633,289 | 12/1986 | Chen | 257/375 |
| 4,656,493 | 4/1987 | Adler et al. | 257/376 |
| 4,684,413 | 8/1987 | Goodman et al. | 257/617 |
| 4,710,477 | 12/1987 | Chen | 437/34 |
| 4,716,451 | 12/1987 | Hsu et al. | 257/371 |
| 4,805,008 | 2/1989 | Yao et al. | 257/376 |
| 4,920,396 | 4/1990 | Shinohara et al. | 257/190 |
| 5,070,381 | 12/1991 | Scott et al. | 257/370 |
| 5,097,308 | 3/1992 | Salih | 257/590 |

FOREIGN PATENT DOCUMENTS

| | | | |
|---|---|---|---|
| 23656 | 2/1981 | European Pat. Off. | 257/617 |
| 3123949A1 | 2/1982 | Germany . | |
| 54-138380 | 10/1979 | Japan | 257/156 |
| 55-156362 | 12/1980 | Japan | 257/617 |
| 59-76431 | 5/1984 | Japan | 257/617 |
| 1334520 | 10/1973 | United Kingdom | 257/523 |
| 1525936 | 9/1978 | United Kingdom | 257/590 |

OTHER PUBLICATIONS

Sze, S. M., "Physics of Semiconductor Devices," 1981, p. 21.

"Proximity gettering with mega-electron-volt carbon and oxygen implantations", by H. Wong et al., Appl. Phys. Lett. 52, No. 12, Mar. 1988, pp. 1023–1025.

Primary Examiner—Sara W. Crane
Assistant Examiner—John Guay
Attorney, Agent, or Firm—Lowe, Price, LeBlanc & Becker

[57] ABSTRACT

The present invention is mainly characterized in that a semiconductor device having a well which is of the same conductivity type as that of a substrate and which is isolated from the substrate is improved not to cause interference between the well and the substrate even if a large amount of minority carriers are implanted. The semiconductor device is provided with a semiconductor substrate of the first conductivity type having the main surface. A first well of a first conductivity type is provided in the main surface of the semiconductor substrate. The first well, having side portions and a bottom portion, extends from the main surface. A second well of a second conductivity type is provided in the main surface of the semiconductor substrate so as to surround the side portions and the bottom portion of the first well. The bottom portion of the second well has a crystal defect region.

10 Claims, 7 Drawing Sheets

SEMICONDUCTOR DEVICE HAVING CRYSTALLINE DEFECT ISOLATION REGIONS

This application is a continuation of application Ser. No. 07/940,131 filed Sep. 3, 1992, now abandoned.

BACKGROUND OF THE INVENTION

1. Field of the Invention

The present invention generally relates to a semiconductor device and, more particularly, to an improved semiconductor device having a well which is isolated from a substrate and is of the same conductivity type as that of the substrate so that the well and the substrate may not interfere with each other, even when a large amount of minority carriers are implanted. The present invention further relates to a method of manufacturing such a semiconductor device.

2. Description of the Background Art

FIG. 8 is a cross-sectional view of a conventional semiconductor device including a well of two-layered structure. A P type semiconductor substrate 1 has, provided at a main surface, N wells 5, 6, and a P well 2 and a P well 3 provided adjacent thereto. In addition, a P well 4 is provided in the N well 6.

A dynamic random access memory as shown in FIG. 9 is, for example, formed in the P well 4. Referring to FIGS. 8 and 9, the N well 6 is provided in the P type semiconductor substrate 1 and the P well 4 is provided in the N well 6. A word line 32 is provided at the main surface of the P well 4. $N^+$ diffusion layers 21 (each hereinafter referred to as an $N^+$ layer) are provided at the main surface of the P well 4 at both sides of the word line 32. A storage node 33 is connected to one of the $N^+$ layers 21, and a cell plate 34 is provided on the storage node 33 with a capacitor insulating film 36 interposed therebetween. A bit line 31 is connected to the other of the $N^+$ layers 21.

Advantages of the well of two-layered structure shown in FIG. 8 will now be described.

Referring to FIG. 8, the P well 4 is isolated by junctions from the P wells 2, 3 directly formed at the main surface of the P type semiconductor substrate 1 with the N wells 5, 6 interposed therebetween. As a result, since the P well 4 seldom interferes with the P wells 2, 3, devices (not shown) formed in respective wells and affecting each other can be isolated from each other. A device element likely to be affected by implantation of minority carriers can also be isolated from other device elements. For example, even if minority carriers are generated in the P well 4, these minority carriers are absorbed in the N well 6, whereby they do not reach device elements (not shown) formed in the P wells 2, 3 which are likely to be affected by implantation of minority carriers.

While the well of two-layered structure has advantages as described above, it also has disadvantages described in the following.

Referring to FIG. 10, when a large amount of minority carriers are implanted in the P well 4 at a time, the N well 6 absorbs the minority carriers a lot, whereby an increase in resistance component is caused in the N well 6, which results in a voltage drop. As a result, when a region 6a in the N well 6 directly beneath the $N^+$ layer. 21 becomes a low potential, the region 6a becomes forward biased with respect to the P type semiconductor substrate 1. As a result, a PNP transistor is turned on and interference occurs between the P well 4 and the P type semiconductor substrate 1.

Referring to FIG. 11, when a voltage of 4.3 V exceeding 3.3 V is applied to the $P^+$ layer 22 provided in the main surface of the N well 5, a large amount of minority carriers are implanted in the N well 5 from the $P^+$ layer 22. In this case, high potential portions are produced by implantation of high potential carriers in P type regions 4a, 3a, 1a of the P well 4, the P well 3 and the P type semiconductor substrate 1 which are adjacent the N well 5. This causes, for example, the P well 4 and the $N^+$ layer 21 to be biased in a forward direction, whereby a current flows in the $N^+$ layer 21 and erases storage information of, for example, a DRAM.

As described above, a conventional well having two-layered structure was likely to be affected by implantation of a large amount of minority carriers. Referring to FIG. 10, there were various problems to be solved that it was necessary to increase a concentration of the N well 6 at the sacrifice of a junction breakdown so as not to generate a voltage drop, or to divide the N well 6 into smaller wells at the sacrifice of degree of integration.

SUMMARY OF THE INVENTION

One object of the present invention is to improve a semiconductor device having a well which is isolated from a substrate and is of the same conductivity type as that of the substrate so that the well and the substrate may not interfere with each other even when a large amount of minority carriers are implanted.

Another object is to provide a semiconductor device which can isolate device elements likely to be affected by implantation of minority carriers.

Still another object is to provide a semiconductor device which can isolate device elements which affect each other.

A further object of the present invention is to provide a method of manufacturing a semiconductor device as described above.

A semiconductor device according to the present invention has a semiconductor substrate of a first conductivity type having a main surface, and a first well of a first conductivity type provided in the main surface of the semiconductor substrate. The first well, having side portions and a bottom portion, extends from the main surface. The semiconductor device is further provided with a second well of a second conductivity type provided in the main surface of the semiconductor substrate to surround the side portions and the bottom portion of the first well. The bottom of the second well has a crystal defect region.

In a method of manufacturing a semiconductor device according to another aspect of the present invention, a semiconductor substrate of a first conductivity type is first prepared. A first well of a first conductivity type having side portions and a bottom portion and extending from the above-described main surface is provided in the main surface of the semiconductor substrate. A second well of a second conductivity type having side portions and a bottom portion to surround the side portions and the bottom portion of the first well is provided in the main surface of the semiconductor substrate. A crystal defect region is formed on the bottom portion of the second well.

In the semiconductor device according to the present invention, the bottom portion of the second well has a crystal defect region. The crystal defect region traps unnecessary carriers, thereby reducing unnecessary carriers. In other words, even if a large amount of minority carriers are implanted in the first well of the first conductivity type provided in the main surface of the semiconductor substrate, these carriers are trapped in the crystal defect region provided at the bottom portion of the second well of the second conductivity type. As a result, interference does not occur between the first well of a first conductivity type and the semiconductor substrate.

In the method of manufacturing a semiconductor device according to the present invention, a crystal defect region is formed at the bottom portion of the second well. The crystal defect region traps unnecessary carriers, thereby reducing unnecessary carriers. In other words, in a semiconductor device manufactured according to the method, even if a large amount of minority carriers are implanted in the first well of the first conductivity type provided in the main surface of the semiconductor substrate, these carriers are trapped in the crystal defect region provided at the bottom portion of the second well of the second conductivity type. As a result, interference does not occur between the first well of first conductivity type and the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings.

Figure 1:
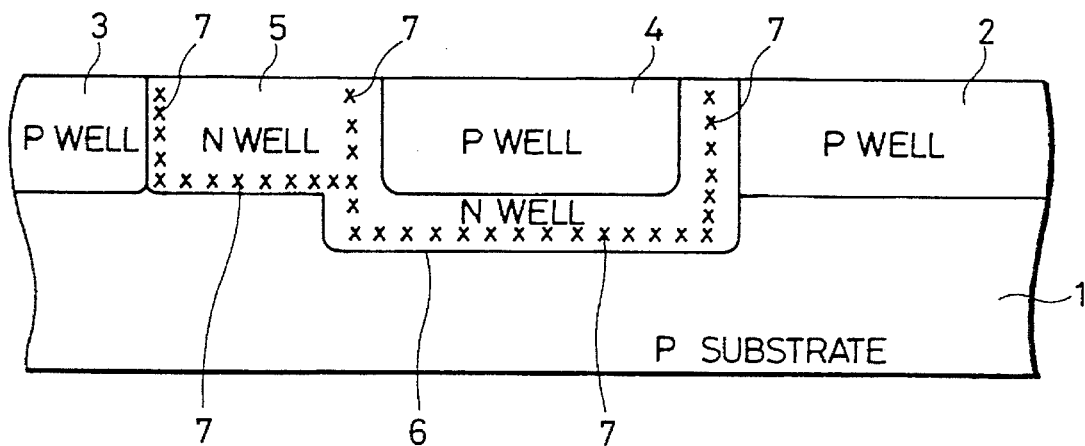
FIG. 1 is a cross-sectional view of conductor device according to one embodiment of the present invention.

FIG. 1 is a cross-sectional view of a semiconductor device according to one embodiment of the present invention.

Referring to FIG. 1, an N well 6 is provided in the main surface of a P type semiconductor substrate 1. An N well 5 is provided adjacent to the N well 6 in the main surface of the P type semiconductor substrate 1. In addition, the P type semiconductor substrate 1 has, in the main surface, a P well 2 provided adjacent the N well 6 and a P well 3 provided adjacent the N well 5. A P well 4 is provided in the N well 6. The P well 4, having side portions and a bottom portion, extends from the main surface. The N well 6 is provided so as to surround the side portions and the bottom portion of the P well 4. The side and bottom portions of the N well 6 has a crystal defect region 7 provided so as to surround the P well 4. The crystal defect region 7 is formed by implanting therein $N^+$ impurity ions by a dose of $3\times10^{13}$ $cm^{-2}$ or more. The crystal defect region 7 is also formed by injecting therein elements of a dose of at least $3\times10^{13}$ $cm^{-2}$ selected from the group consisting of Si, O, F and C and not contributing to the conductivity type.

The P well 4 may be provided with, for example, a dynamic random access memory, and the N well 5 may be provided with a P channel transistor. The description will be given later.

Operation will now be described.

Figure 2:
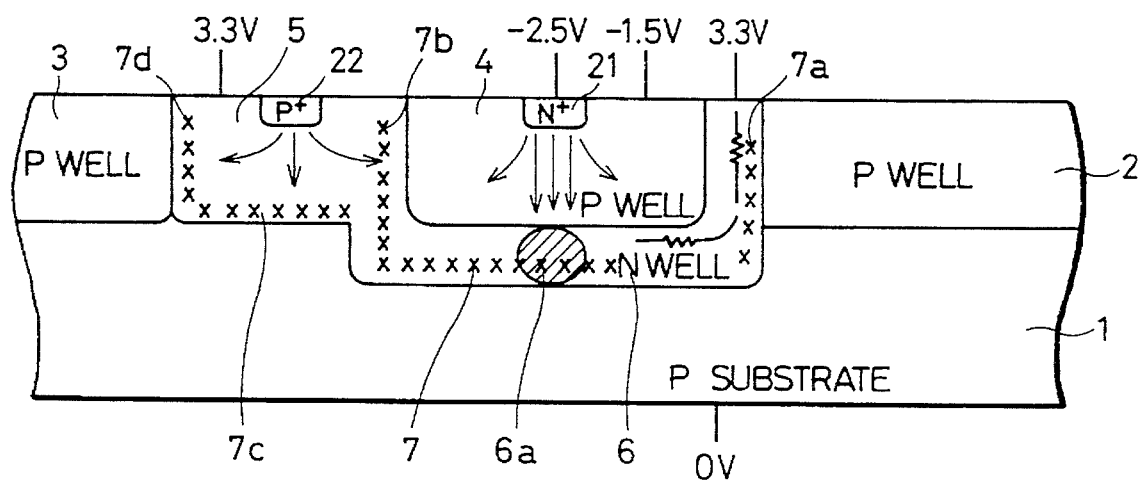
FIG. 2 is a cross-sectional view for explaining functions of a semiconductor device according to the present invention.

Referring to FIG. 2, when an $N^+$ layer 21 becomes a potential (−2.5 V) lower than that of the P well 4 (−1.5 V), a large amount of minority carriers are implanted in the P well 4, thereby generating a low potential region in a portion 6a directly beneath the $N^+$ layer 21 of the N well 6.

When a PNP transistor generated formed of the P well 4, the N well 6, and the P type semiconductor 1 is rendered an on state, minority carriers are trapped into the crystal defect region 7 at the bottom of the N well 6 (which corresponds to a base), whereby life time of these carriers is shortened. As a result, operation of a PNP transistor is substantially hampered, thereby blocking conduction between the P well 4 and the P type semiconductor substrate 1 for the P well 2 or the P well 3).

A crystal defect layer 7a formed at a side portion of the N well 6 traps minority carriers which are moved in a lateral direction out of the $N^+$ layer 21, thereby preventing the P well 4 and the P well 2 from interfering with each other through the N well 6 present at their boundary on the same principle as described above.

When a $P^+$ layer 22 formed in the N well 5 becomes a potential higher than that of the N well 5 (3.3 V), minority carriers flow in defect layers 7b, 7c, 7d at side portions and a bottom portion of the N well 5 out of the $P^+$ layer 22, thereby shortening life time of these minority carriers. As a result, conduction between the N well 5 and the P well 4, between the N well 5 and the P type semiconductor substrate 1, and between the N well 5 and the P well 3 is blocked by crystal defect layers 7b, 7c and 7d, respectively.

Figure 3:
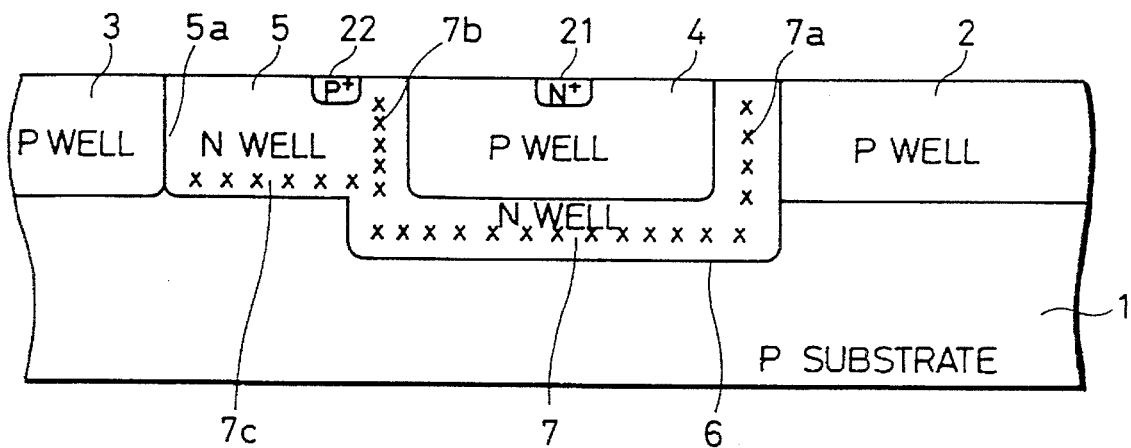
FIG. 3 is a cross-sectional view of a semiconductor device according to another embodiment of the present invention.

FIG. 3 is a cross-sectional view of a semiconductor device according to another embodiment of the present invention. It is pointed out that, in the embodiment shown in FIG. 3 as well as other embodiments shown in other figures in the present application, the same portions as ones in the embodiment shown in FIG. 1 are denoted by the same reference numerals and the same or the similar description is not repeated. Referring to FIG. 3, if the distance between the $P^+$ layer 22 and the P well 3 is 10 or more times longer than the vertical distance between the bottom of the N well 5 and the $P^+$ layer 22, it is not necessary to provide a crystal defect region at a side portion 5a of the N well 5.

Figure 4:
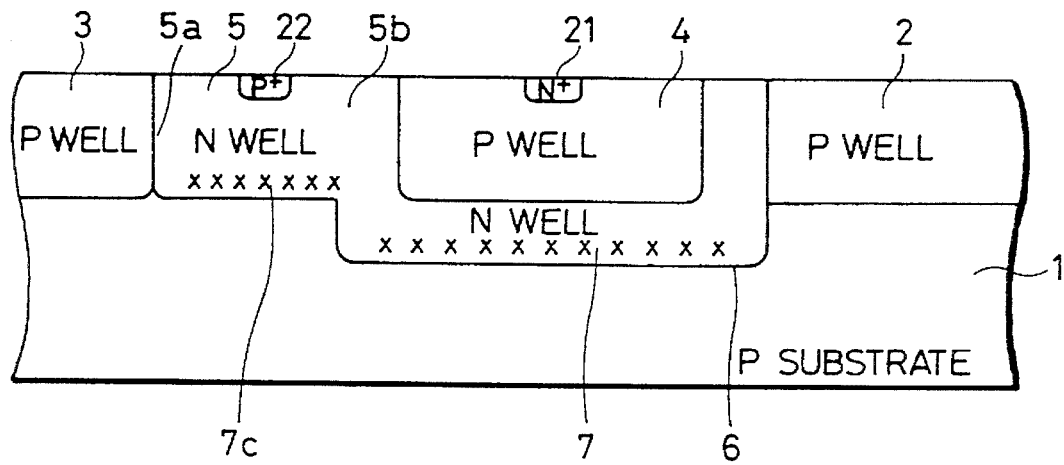
FIG. 4 is a cross-sectional view of a semiconductor device according to still another embodiment of the present invention.

FIG. 4 is a cross-sectional view of a semiconductor device according to still another embodiment of the present invention. As shown in FIG. 4, when the P$^+$ layer 22 is provided remote from both the P well 3 and the P well 4, since it becomes possible to ignore flow of carriers which are moved in a lateral direction out of the P$^+$ layer 22, it is not necessary to provide a crystal defect region at side portions 5a, 5b of the N well 5.

Figure 5:
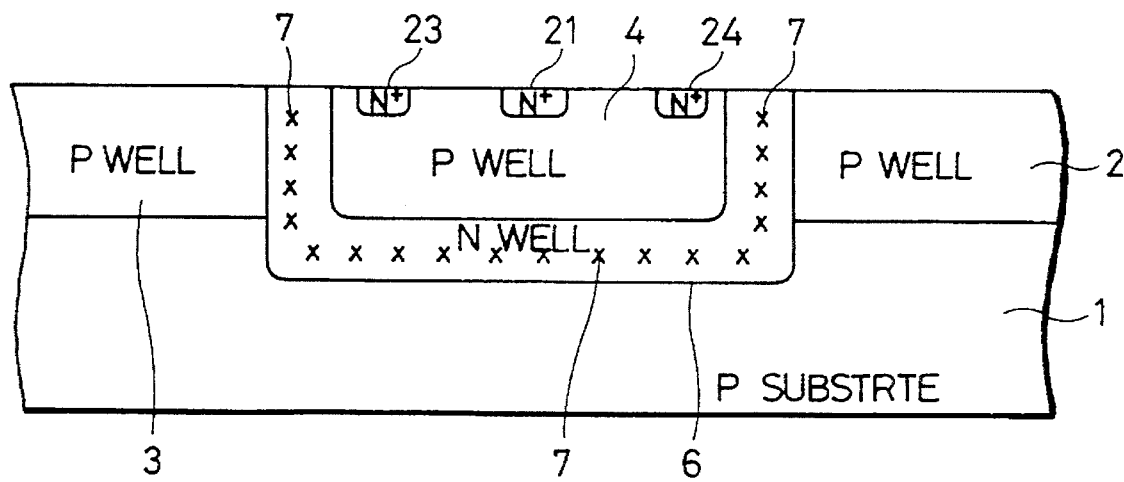
FIG. 5 is a cross-sectional view of a semiconductor device according to a further embodiment of the present invention.

FIG. 5 is a cross-sectional view of a semiconductor device according to a further embodiment of the present invention. A semiconductor device shown in FIG. 5 differs from one shown in FIG. 3 in that the N well 5 is omitted and that N$^+$ layers 23, 24 are provided in a position close to an end portion of the P well 4. In such structure, it is necessary to form the crystal defect region 7 not only at a bottom portion but also at side portions of the N well 6.

Figure 6:
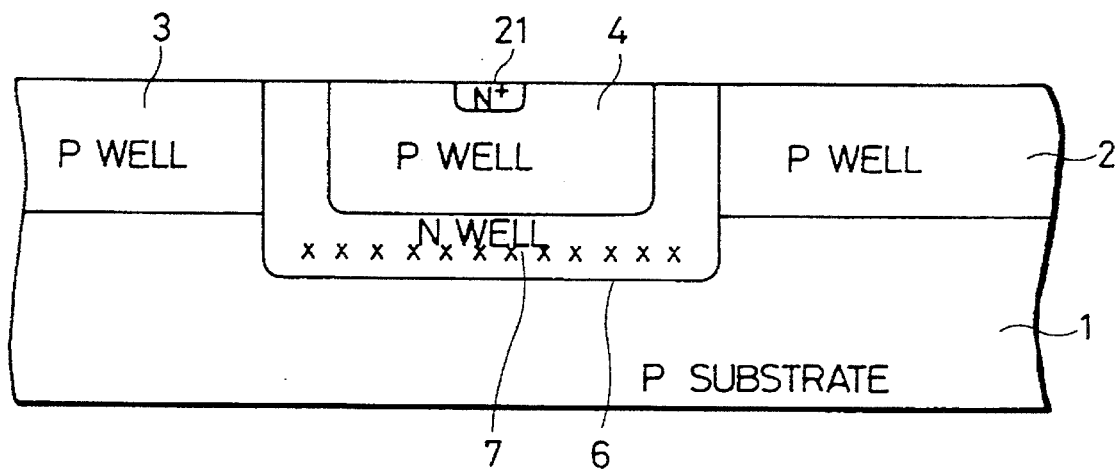
FIG. 6 is a cross-sectional view of a semiconductor device according to a further embodiment of the present invention.

As shown in FIG. 6, when the N well 6 does not have an N$^+$ layer provided in a position close to an end portion of the P well 4, it is not necessary to form a crystal defect region at side portions of the N well 6.

A method of manufacturing a semiconductor device shown in FIG. 1 will now be described with reference to FIG. 7.

Figure 7A:
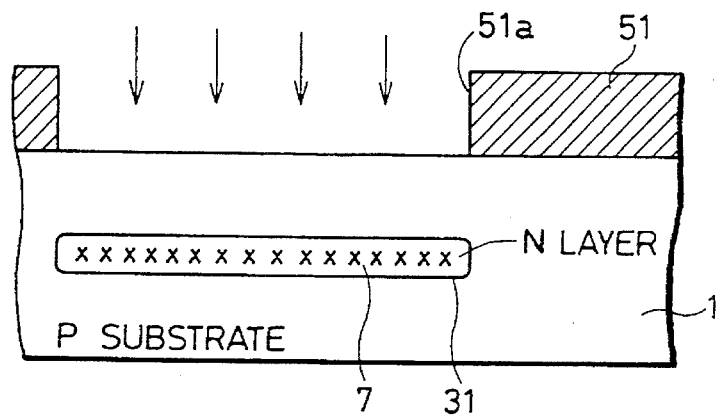
FIGS. 7(a)–7(d) are cross-sectional views of portions of a semiconductor device in each step of a manufacturing method according to one embodiment of the present invention.

Referring to FIG. 7(a), a resist pattern 51 having an opening 51a in a portion where an N well is to be formed is provided on the P type semiconductor substrate 1. With the resist pattern 51 used as mask, phosphorus of a dose of $3\times10^{13}-1\times10^{16}$ cm$^{-2}$ is implanted on the main surface of the semiconductor substrate 1 at a high energy of 1–5 MeV. A bottom portion 31 of the N well is formed by the implantation of phosphorus. Since phosphorus is implanted by a high dose of $3\times10^{13}-1\times10^{16}$ cm$^{-2}$, the crystal defect region 7 is formed at the bottom portion 31 at that time.

The crystal defect region 7 is also formed by implanting N type impurity ions together with elements which do not contribute to the conductivity type onto the main surface of the semiconductor substrate 1. In this case, it is preferred that a dose of N type impurity ions is made at least $1\times10^{12}$ cm$^{-2}$, and that a dose of elements which do not contribute to the conductivity type is made at least $3\times10^{13}$ cm$^{-2}$, and that the N type impurity ions and the above-described elements are implanted at an implantation energy of 1–5 MeV. The crystal defect region 7 may also be formed by the following method. More specifically, the N well 6 is formed by thermal diffusion of N type impurity ions. Then elements selected from the group consisting of Si, O, F and C and not contributing to the conductivity type are implanted onto the main surface of the semiconductor under the condition of a dose of at least $3\times10^{13}$ cm$^{-2}$ and of an implantation energy of 1–5 MeV. The crystal defect region 7 is also formed on the bottom portion of the N well 6 by such a method like this.

Figure 7B:
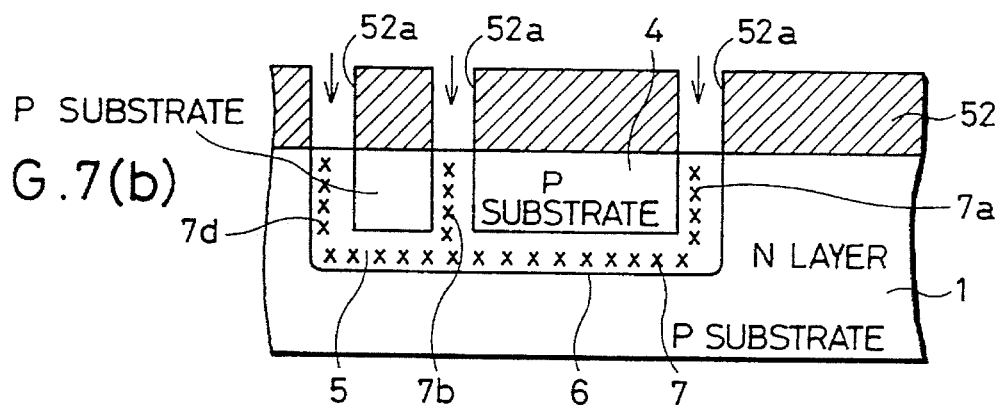

Referring t FIG. 7(b), a resist pattern 52 having an opening 52a in a portion where side portions of the N well 6 and the N well 5 are to be formed is provided on the semiconductor substrate 1. With a resist pattern 52 used as mask, phosphorus is implanted onto the main surface of the semiconductor substrate 1 under the condition of an implantation energy of 100 KeV–1 MeV and of a dose of $3\times10^{12}-1\times10^{16}$ cm$^{-2}$. By the implantation of phosphorus, side portions of the N wells 6 and 5 are formed and implantation damages are formed at the side portions. Thereafter, the implantation damages become crystal defect regions 7a, 7b, 7d, unrecoverable secondary defects, by carrying out annealing in a furnace.

Ions may be implanted at least two times at different implantation energy to form side portions. In addition, such elements as Si, F, O and C which do not contribute to the conductivity type may be implanted simultaneously.

Figure 7C:
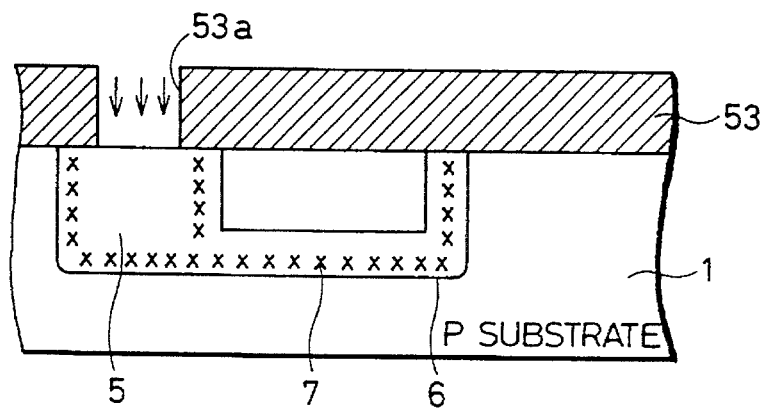

Referring to FIG. 7(c), a resist pattern 53 having an opening 53a in a portion where the N well 5 is to be formed is provided on the semiconductor substrate 1. With the resist pattern 53 used as mask, at an implantation energy of 100 keV–1 MeV, phosphorus of a dose of $1\times10^{12}\times1\times10^{15}$ cm$^{-2}$ is implanted once or at least twice onto the main surface of the semiconductor substrate 1. Rapid heating to a high temperature by a lamp annealing forces implantation damages to travel to the silicon surface, thereby forming the N well 5 having no secondary defect.

Figure 7D:
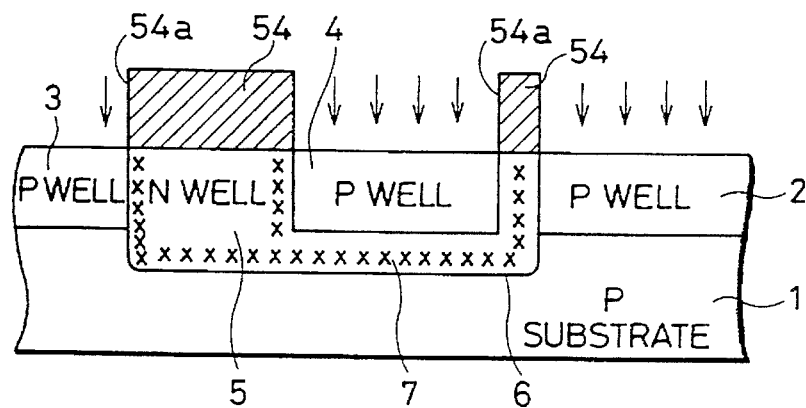
Figure 8:
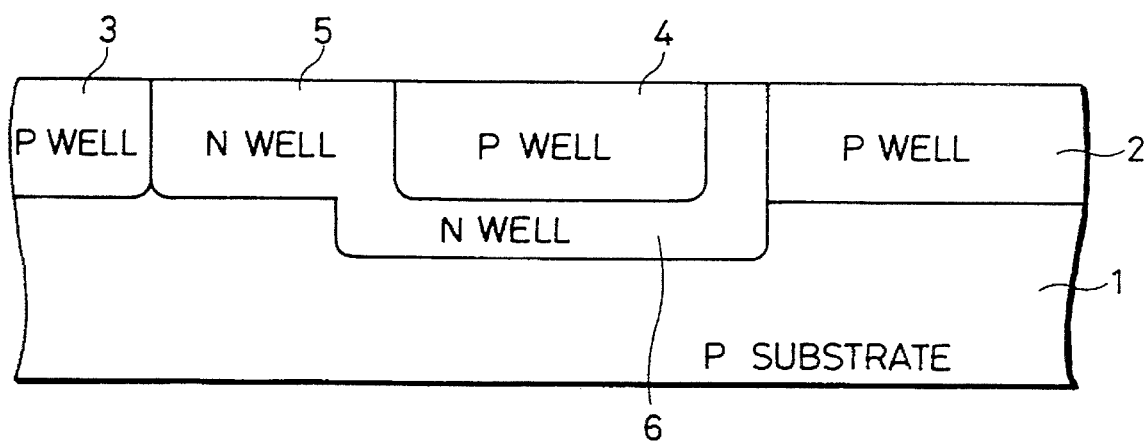
FIG. 8 is a cross-sectional view of a semiconductor device having two-layered well structure.
Figure 9:
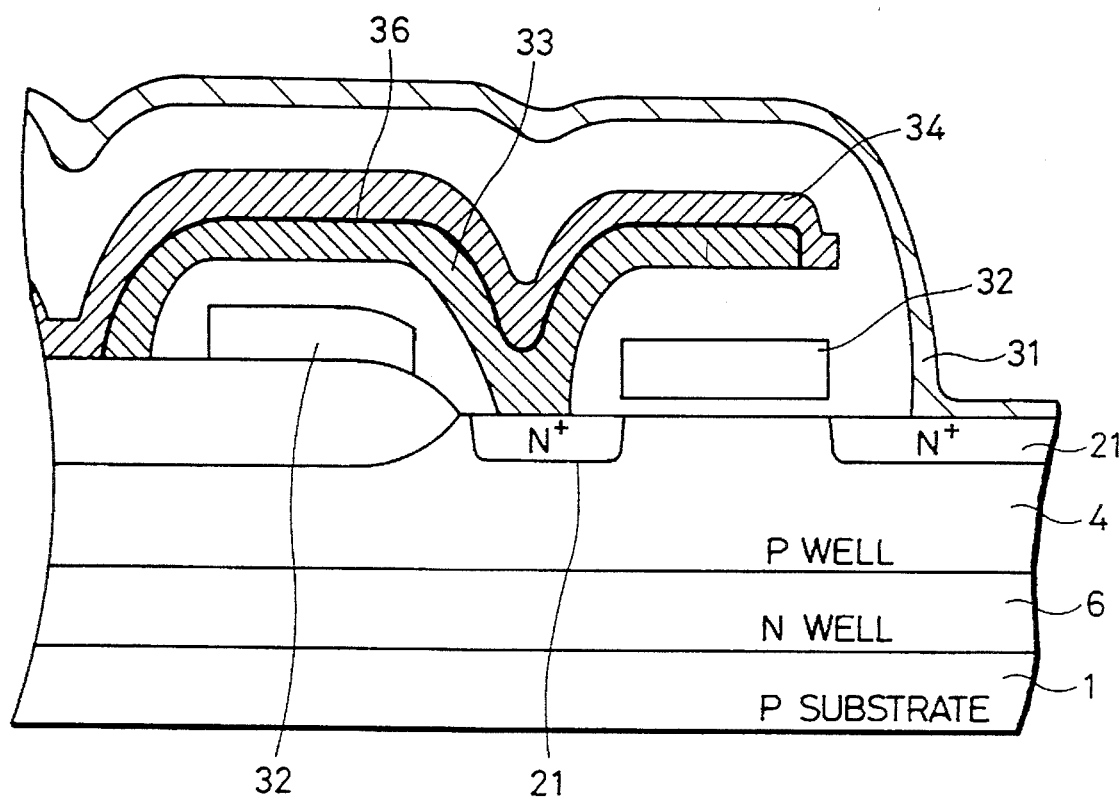
FIG. 9 is a cross-sectional view of one example of a semiconductor element formed in a semiconductor device having two-layered well structure.
Figure 10:
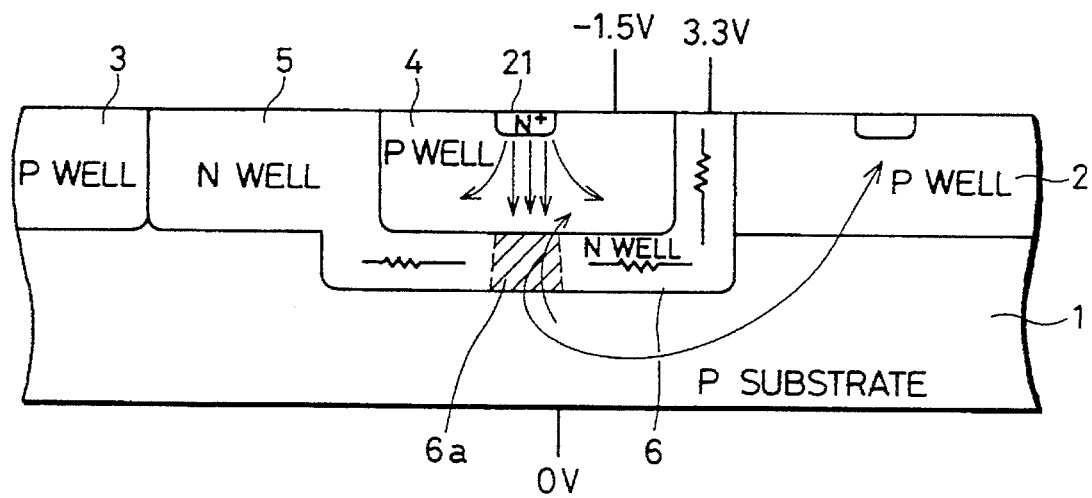
FIG. 10 is a cross-sectional view showing a disadvantage of a conventional semiconductor device having two-layered well structure.
Figure 11:
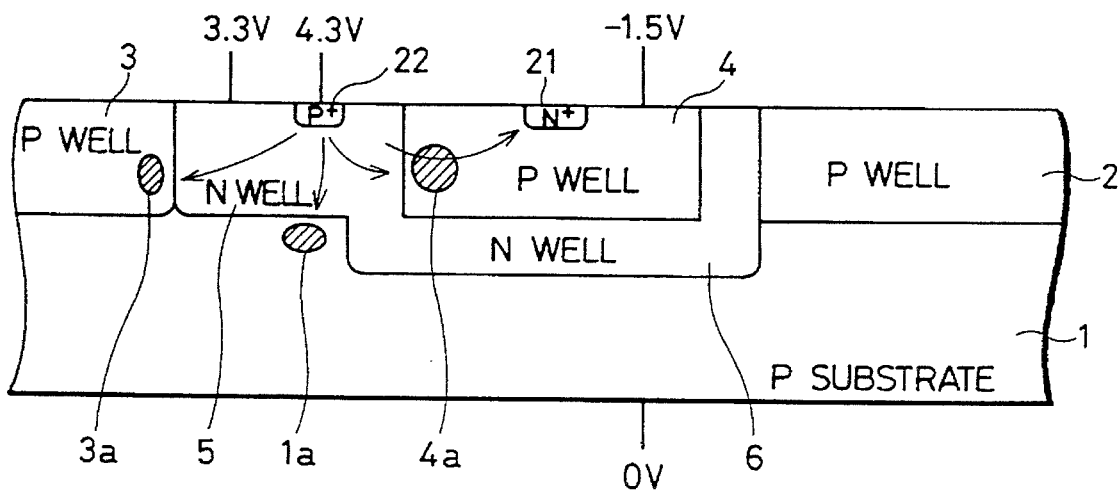
FIG. 11 is a cross-sectional view showing another disadvantage of a conventional semiconductor device having two-layered well structure.

Referring to FIG. 7(d), a resist pattern 54 having an opening 54a in a portion where the P well 4, the P well 2 an the P well 3 are to be formed is provided on the semiconductor substrate 1. With the resist pattern 54 used as mask, at an the energy of 20 keV–1 MeV, boron of a dose of $1\times10^{12-1\times10^{15}}$ cm$^{-2}$ is implanted once or at least twice, so as not to generate a crystal defect, onto the main surface of the semiconductor substrate 1. The P well 4, the P well 2 and the P well 3 are formed in this way.

Figure 12:
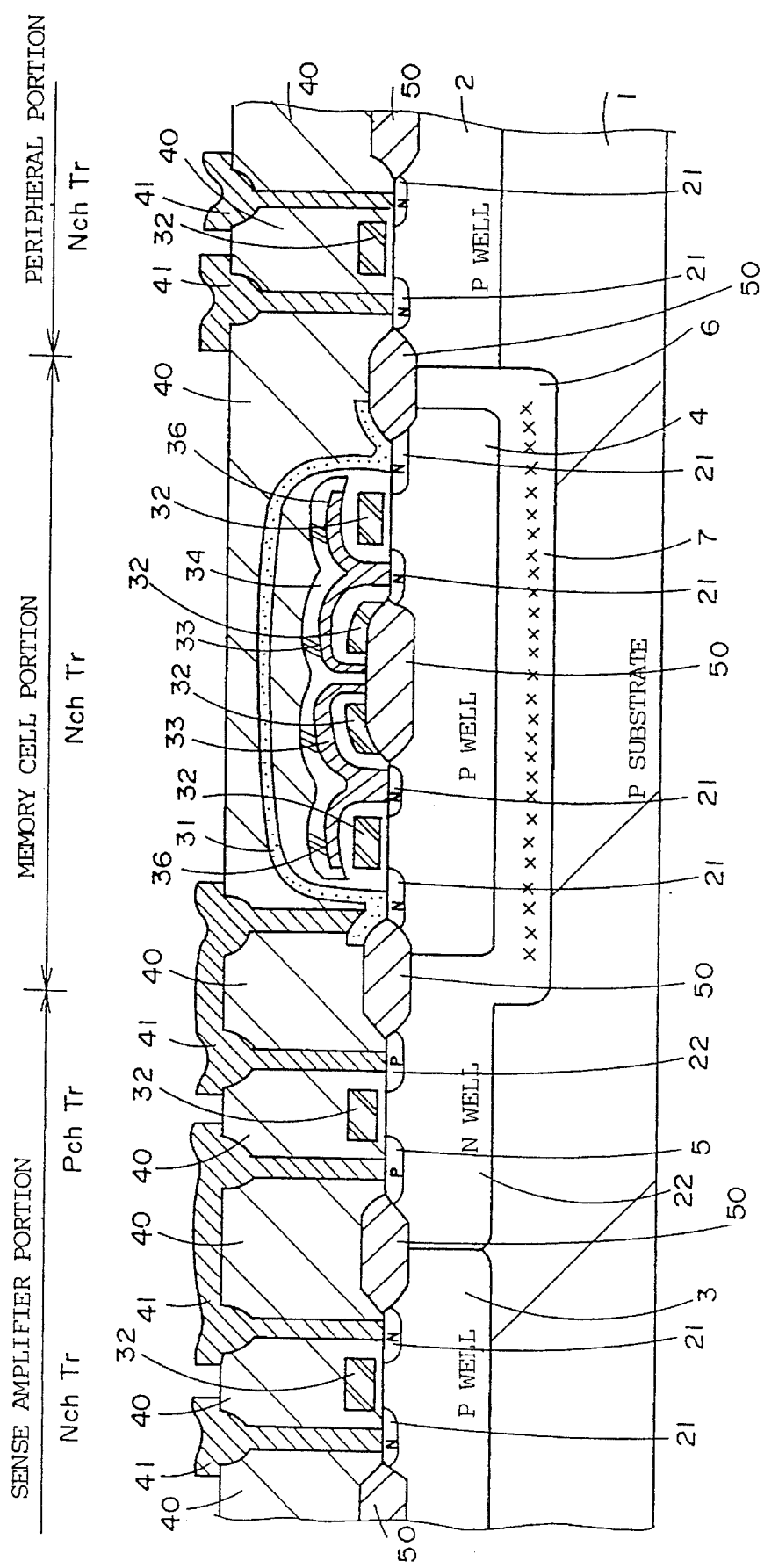
FIG. 12 is a cross-sectional view of a semiconductor substrate to which the present invention is applied.

FIG. 12 is a cross-sectional view of a specific semiconductor device to which the present invention is applied. FIG. 12 is a cross-sectional view of a portion where a sense amplifier portion, a memory cell portion and a peripheral portion of the semiconductor device are formed. The N well 6 and the N well 5 connected thereto are provided on the main surface of the semiconductor substrate 1 (a silicon substrate). The P well 2 is provided adjacent to the N well 6. The P well 3 is provided adjacent to the N well 5. The P well 4 is provided in the N well 6. The P well 4 is a well isolated from the semiconductor substrate 1. The crystal defect region 7 is provided at the bottom portion of the N well 6. The memory cell portion is provided in the P well 4, isolated by an isolation oxide film 50 therefrom. The memory cell portion includes a pair of N$^+$ layers 21 formed on the surface of the P well 4, a word line 32 provided on the substrate 1, a storage node 33 connected to the N$^+$ layers 21, a capacitor dielectric film 36 provided on the storage node 33, and a cell plate 34 provided on the capacitor dielectric film 36. The bit line 31 is connected to the N$^+$ layers 21. The N well 5 has a pair of P$^+$ layers 22 provided in the main surface thereof, and a word line 32 provided thereon. The P well 3 has a pair of N$^+$ layers 21 provided in the main surface thereof and a word line 32 provided thereon. The P well 2 has a pair of N$^+$ layers 21 provided in the main surface thereof, and a word line 32 provided thereon. An interlayer insulating film 40 is formed on the semiconductor substrate 1 so as to cover the memory cells and the word lines 32. Contact holes are provided at the predetermined portions in the interlayer insulating films 40, through which aluminum interconnections 41 are connected to respective N$^+$ layers 21, P$^+$ layers 22, and bit lines 31.

According to the semiconductor device constituted as described above, since the crystal defect region 7 is formed at the bottom portion of the N well 6, the crystal defect region 7 traps unnecessary carriers, thereby reducing unnecessary carriers. Therefore, even if a large amount of minority carriers are implanted in the P well 4, these minority carriers are trapped in the crystal defect region (7) provided at the bottom portion of the N well 6. As a result, interference does not occur between the P well 4 and the semiconductor substrate 1.

As described above, in the semiconductor device according to the present invention, a crystal defect region is provided at the bottom portion of the second well of the second conductivity type. The crystal defect region traps unnecessary carriers, thereby reducing life time of unnecessary carriers. As a result, even if a large amount of minority carriers are implanted in the first well of the first conductivity type provided in the main surface of the semiconductor substrate, these minority carriers are trapped in the crystal defect region provided at the bottom portion of the second well of the second conductivity type. Therefore, there has an effect that interference does not occur between the first well of the first conductivity type and the semiconductor substrate.

In the method of manufacturing a semiconductor device according to the present invention, the crystal defect region is formed at the bottom portion of the second well. The crystal defect region traps unnecessary carriers, thereby reducing life time of unnecessary carriers. As a result, by using this method, a semiconductor device can be obtained in which, interference does not occur between the first well of the first conductivity type and the semiconductor substrate since, even if a large amount of minority carriers are implanted in the first well of the first conductivity type provided in the main surface of the semiconductor substrate, these minority carriers are trapped in the crystal defect region provided at the bottom portion of the second well of the second conductivity type.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate of a first conductivity type having a main surface;
   a first well of said first conductivity type extending from said main surface of said semiconductor substrate, said first well having a boundary comprising side boundaries and a bottom boundary; and
   a second well of a second conductivity type extending from said main surface into said semiconductor substrate and having a boundary at least partially surrounding said boundary of said first well, a crystal defect region confined entirely within said second well and formed only proximate the boundary of said second well, wherein
   said first well has no substantial crystalline damage, and
   said boundary of said second well includes a lower boundary portion extending beneath said first well.

2. A semiconductor device according to claim 1, wherein said boundary of said second well further includes a side boundary, and the crystal defect region extends along substantially the entire side boundary.

3. A semiconductor device according to claim 1, further comprising:
   a third well of a second conductivity type extending from said main surface and adjacent said second well, said third well having a crystal defect region confined therein and formed only proximate a boundary thereof.

4. A semiconductor device according to claim 3, wherein said crystal defect region in said third well is only proximate a side boundary thereof.

5. The semiconductor device according to claim 3, further comprising:
   a fourth well of a first conductivity type extending from said main surface and adjacent said second well.

6. The semiconductor device according to claim 1, wherein
   impurity ions of a second conductivity type of a dose of at least $3 \times 10^{13}$ cm$^{-2}$ are implanted onto the bottom portion of said second well.

7. The semiconductor device according to claim 1, wherein
   elements of a dose of at least $3 \times 10^{13}$ cm$^{-2}$ which do not contribute to conductivity are implanted onto the bottom portion of said second well.

8. The semiconductor device according to claim 7, wherein
   said elements which do not contribute to conductivity are selected from the group consisting of Si, O, F and C.

9. The semiconductor device according to claim 7, wherein phosphorous at a dose of $3 \times 10^{13} - 1 \times 10^{16}$ cm$^{-2}$ is implanted into the bottom portion of said second well.

10. A semiconductor device, comprising:
    a semiconductor substrate of a first conductivity type having a main surface;
    a pair of source/drain regions on said main surface with a channel region therebetween;
    a gate electrode above said channel region with an insulating layer therebetween;
    a first well of said first conductivity type extending from said main surface of said semiconductor substrate, said first well having a boundary comprising side boundaries and a bottom boundary; and
    a second well of a second conductivity type extending from said main surface into said semiconductor substrate and having a boundary at least partially surrounding said boundary of said first well, a crystal defect region confined entirely within said second well and formed only proximate the boundary of said second well, wherein said first well has no substantial crystalline damage, and wherein
    said boundary of said second well includes a lower boundary portion extending beneath said first well.

\* \* \* \* \*